US010400322B2

(12) United States Patent
Xu et al.

(10) Patent No.: US 10,400,322 B2
(45) Date of Patent: Sep. 3, 2019

(54) FABRICATION OF THERMALLY STABLE NANOCAVITIES AND PARTICLE-IN-CAVITY NANOSTRUCTURES

(71) Applicant: University of Florida Research Foundation, Inc., Gainesville, FL (US)

(72) Inventors: Cheng Xu, Chandler, AZ (US); Luping Li, Sunnyvale, CA (US); Yang Zhao, Gainesville, FL (US); Kirk Jeremy Ziegler, Gainesville, FL (US); Justin C. Wong, Tall Timbers, MD (US)

(73) Assignee: THE UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 15/781,359

(22) PCT Filed: Dec. 2, 2016

(86) PCT No.: PCT/US2016/064664
§ 371 (c)(1),
(2) Date: Jun. 4, 2018

(87) PCT Pub. No.: WO2017/142607
PCT Pub. Date: Aug. 24, 2017

(65) Prior Publication Data
US 2018/0363126 A1 Dec. 20, 2018

Related U.S. Application Data

(60) Provisional application No. 62/263,010, filed on Dec. 4, 2015.

(51) Int. Cl.
*C23C 14/02* (2006.01)
*C25D 11/04* (2006.01)
(Continued)

(52) U.S. Cl.
CPC ............ *C23C 14/022* (2013.01); *C23C 14/30* (2013.01); *C23C 14/34* (2013.01);
(Continued)

(58) Field of Classification Search
CPC .................................................... C25D 11/045
(Continued)

(56) References Cited

U.S. PATENT DOCUMENTS 4,465,562 A 8/1984 Kadooda
5,705,225 A 1/1998 Dornfest et al.
(Continued)

FOREIGN PATENT DOCUMENTS

WO 2015/023966 A1 2/2015

OTHER PUBLICATIONS

Alivisatos, P. The use of nanocrystals in biological detection. Nature Biotechnology 2003, 22, 47-52.
(Continued)

*Primary Examiner* — Roberts P Culbert
(74) *Attorney, Agent, or Firm* — Thomas Horstemeyer, LLP

(57) ABSTRACT

Various examples related to fabrication of thermally stable ultra-high density particle-in-cavity (PIC) nanostructures. In one example, a method includes disposing an anodized aluminum oxide (AAO) template onto a surface of a substrate; removing, from the AAO template, a support layer disposed on a side of the AAO template opposite the surface of the substrate; etching nanocavities into the surface of the substrate using the AAO template as an etch mask; and removing the AAO template from the surface of the substrate. The method can include fabricating the AAO template on an aluminum substrate by anodization of an aluminum
(Continued)

film and removing the AAO template from the aluminum substrate after formation of the support layer on the AAO template.

20 Claims, 12 Drawing Sheets

(51) Int. Cl.
| | |
|---|---|
| C23C 16/02 | (2006.01) |
| C23C 16/453 | (2006.01) |
| C23C 16/455 | (2006.01) |
| C23C 16/54 | (2006.01) |
| C23C 14/30 | (2006.01) |
| C23C 14/34 | (2006.01) |
| C23C 14/58 | (2006.01) |
| B82Y 30/00 | (2011.01) |
| B82Y 99/00 | (2011.01) |
| B82Y 40/00 | (2011.01) |

(52) U.S. Cl.
CPC ...... *C23C 14/5806* (2013.01); *C23C 16/0272* (2013.01); *C23C 16/453* (2013.01); *C23C 16/45512* (2013.01); *C23C 16/45514* (2013.01); *C23C 16/45574* (2013.01); *C23C 16/545* (2013.01); *C25D 11/045* (2013.01); *B82Y 30/00* (2013.01); *B82Y 40/00* (2013.01); *B82Y 99/00* (2013.01)

(58) Field of Classification Search
USPC .......................................................... 216/51
See application file for complete search history.

(56) References Cited

U.S. PATENT DOCUMENTS

| | | | |
|---|---|---|---|
| 5,948,570 | A | 9/1999 | Komblit et al. |
| 7,850,941 | B2 | 12/2010 | Tsakalakos et al. |
| 8,084,101 | B2 | 12/2011 | Das |
| 8,269,257 | B2 | 9/2012 | Gradecak et al. |
| 8,389,393 | B2 | 3/2013 | Gradecak et al. |
| 8,617,909 | B2 | 12/2013 | Batres et al. |
| 9,023,422 | B1 | 5/2015 | Sridhar et al. |
| 2006/0211152 | A1 | 9/2006 | Peng et al. |
| 2006/0289351 | A1 | 12/2006 | Xiao et al. |
| 2009/0214851 | A1 | 8/2009 | Corderman et al. |
| 2010/0086464 | A1 | 4/2010 | Tsakalakos et al. |
| 2010/0108519 | A1 | 5/2010 | Soper et al. |
| 2012/0132529 | A1 | 5/2012 | Zekry et al. |
| 2012/0164433 | A1 | 6/2012 | Advincula |
| 2012/0288647 | A1 | 11/2012 | Lee |
| 2013/0177738 | A1* | 7/2013 | Mardilovich ....... B81C 1/00031 428/141 |
| 2014/0202868 | A1 | 7/2014 | Afzulpurkar et al. |

OTHER PUBLICATIONS

Kotov, N. A.; Weiss, P. S. Self-Assembly of Nanoparticles: A Snapshot. ACS Nano 2014, 8, 3101-3103.
Qiu, J. J.; Wu, Y. C.; Wang, Y. C.; Engelhard, M. H.; McElwee-White, L.; Wei, W. D. Surface Plasmon Mediated Chemical Solution Deposition of Gold Nanoparticles on a Nanostructured Silver Surface at Room Temperature. Journal of the American Chemical Society 2013, 135, 38-41.
Zhou, R. J.; Stalder, R.; Xie, D. P.; Cao, W. R.; Zheng, Y.; Yang, Y. X.; Plaisant, M.; Holloway, P. H.; Schanze, K S.; Reynolds, J. R.; Xue, J. G. Enhancing the Efficiency of Solution-Processed Polymer:Colloidal Nanocrystal Hybrid Photovoltaic Cells Using Ethanedithiol Treatment. ACS Nano 2013, 7, 4846-4854.
Kim, J. Y.; Kotov, N. A. Charge Transport Dilemma of Solution-Processed Nanomaterials. Chemistry of Materials 2014, 26, 134-152.
Fang, Y.; Phillips, B. M.; Askar, K.; Choi, B.; Jiang, P.; Jiang, B. Scalable bottom-up fabrication of colloidal photonic crystals and periodic plasmonic nanostructures. Journal of Materials Chemistry C 2013, 1, 6031-6047.
Choi, J. J.; Wenger, W. N.; Hoffman, R. S.; Lim, Y. F.; Luria, J.; Jasieniak, J.; Marohn, J. A.; Hanrath, T. Solution-Processed Nanocrystal Quantum Dot Tandem Solar Cells. Advanced Materials 2011, 23, 3144-3148.
Xu, L G.; Ma, W.; Wang, L. B.; Xu, C. L; Kuang, H.; Kotov, N. A. Nanoparticle assemblies: dimensional transformation of nanomaterials and scalability. Chem. Soc. Rev. 2013, 42, 3114-3126.
Tarakeshwar, P.; Finkelstein-Shapiro, D.; Hurst, S. J.; Rajh, T.; Mujica, V. Surface-Enhanced Raman Scattering on Semiconducting Oxide Nanoparticles: Oxide Nature, Size, Solvent, and pH Effects. The Journal of Physical Chemistry C 2011, 115, 8994-9004.
Kiravittaya, S.; Heidemeyer, H.; Schmidt, O. G. Growth of three-dimensional quantum dot crystals on patterned GaAs (0 0 1) substrates. Physica E 2004, 23, 253-259.
Gates, B. D.; Xu, Q.; Stewart, M.; Ryan, D.; Willson, C. G.; Whitesides, G. M. New Approaches to Nanofabrication: Molding, Printing, and Other Techniques. Chem. Rev. 2005, 105, 1171-1196.
Gu, X.; Dorsey, P.; Russell, T. P. High Density and Large Area Arrays of Silicon Oxide Pillars with Tunable Domain Size for Mask Etch Applications. Advanced Materials 2012, 24, 5505-5511.
Ghoshal, T.; Shaw, M. T.; Bolger, C. T.; Holmes, J. D.; Morris, M. A. A general method for controlled nanopatterning of oxide dots: a microphase separated block copolymer platform. Journal of Materials Chemistry 2012, 22, 12083-12089.
Ye, J.; Lagae, L.; Maes, G.; Van Dorpe, P. A versatile method to fabricate particle-in-cavity plasmonic nanostructures. Journal of Materials Chemistry 2011, 21, 14394-14397.
Li, X.; Zhang, Y.; Shen, Z. X.; Fan, H. J. Highly Ordered Arrays of Particle-in-Bowl Plasmonic Nanostructures for Surface-Enhanced Raman Scattering. Small 2012, 8, 2548-2554.
Chen, B.; Meng, G.; Zhou, F.; Huang, Q.; Zhu, C.; Hu, X.; Kong, M. Ordered arrays of Au-nanobowls loaded with Ag-nanoparticles as effective SERS substrates for rapid detection of PCBs. Nanotechnology 2014, 25, 145605, 1-8.
Feil, A. F.; Migowski, P.; Dupont, J.; Amaral, L; Teixeira, S. R. Nanoporous Aluminum Oxide Thin Films on Si Substrate: Structural Changes as a Function of Interfacial Stress. The Journal of Physical Chemistry C 2011, 115, 7621-7627.
Christopher, P.; Xin, H.; Linic, S. Visible-light-enhanced catalytic oxidation reactions on plasmonic silver nanostructures. Nature Chemistry 2011, 3, 467-472.
Kang, G. B.; Kim, S. I.; Kim, Y. T.; Park, J. H. Fabrication of metal nano dot dry etching mask using block copolymer thin film. Current Applied Physics 2009, 9, S82-S84.
Wen, T.; Booth, R. A.; Majetich, S. A. Ten-Nanometer Dense Hole Arrays Generated by Nanoparticle Lithography. Nano Letters 2012, 12, 5873-5878.
Martin, J.; Manzano, C. V.; Caballero-Calero, O.; Martin-González, M. High-Aspect-Ratio and Highly Ordered 15-nm Porous Alumina Templates. ACS Applied Materials Interfaces 2013, 5, 72-79.
Foong, T. R. B.; Sellinger, A.; Hu, X. Origin of the Bottlenecks in Preparing Anodized Aluminum Oxide (AAO) Templates on ITO Glass. ACS Nano 2008, 2, 2250-2256.
Miller, C. J.; Majda, M. Microporous aluminum oxide films at electrodes. J. Am. Chem. Soc. 1985, 107, 1419-1420.
Hill, J. J. Haller, K.; Ziegler, K. J. Direct Fabrication of High-Aspect Ratio Anodic Aluminum Oxide with Continuous Pores on Conductive Glass. Journal of the Electrochemical Society 2011, 158, E1-E7.
Furneaux, R. C.; Rigby, W. R.; Davidson, A. P. The formation of controlled-porosity membranes from anodically oxidized aluminium. Nature 1989, 337, 147-149.
PCT International Search Report in co-pending, related PCT Application No. PCT/US2016/064664, dated Jul. 31, 2017.
Huang, et al., "Dressing Plasmons in Particle-in-Cavity Architectures", Nano Letters, 2011, pp. 1221-1226, vol. 11, Issue 3.
Zhan et al., "Sub-100-nm Nanoparticle Arrays With Perfect Ordering and Tunable and Uniform Dimensions Fabricated by Combining

(56) References Cited

OTHER PUBLICATIONS

Nanoimprinting With Ultrathin Alumina Membrane Technique", ACS Nano, 2014, pp. 3862-3868, vol. 8, Issue 4.

* cited by examiner

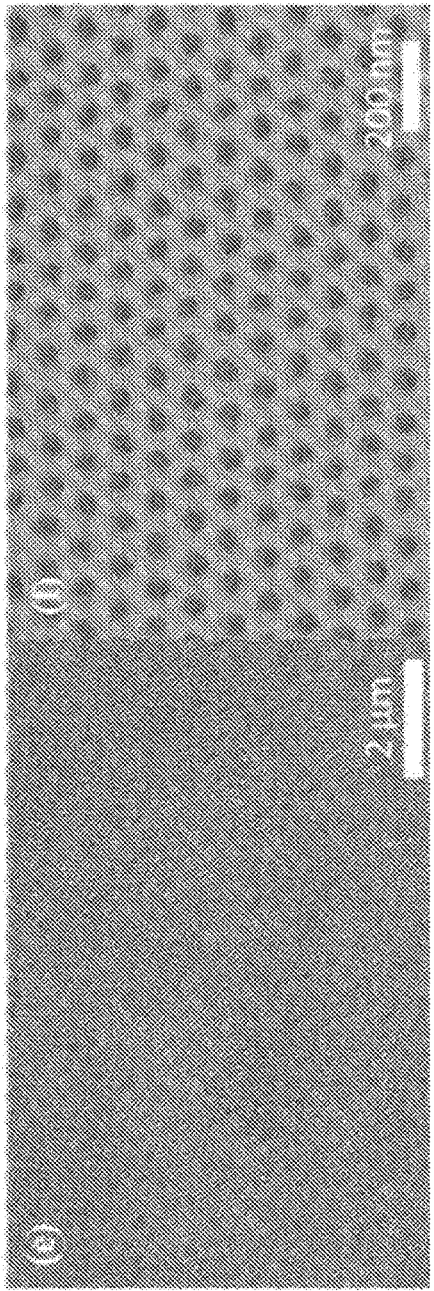
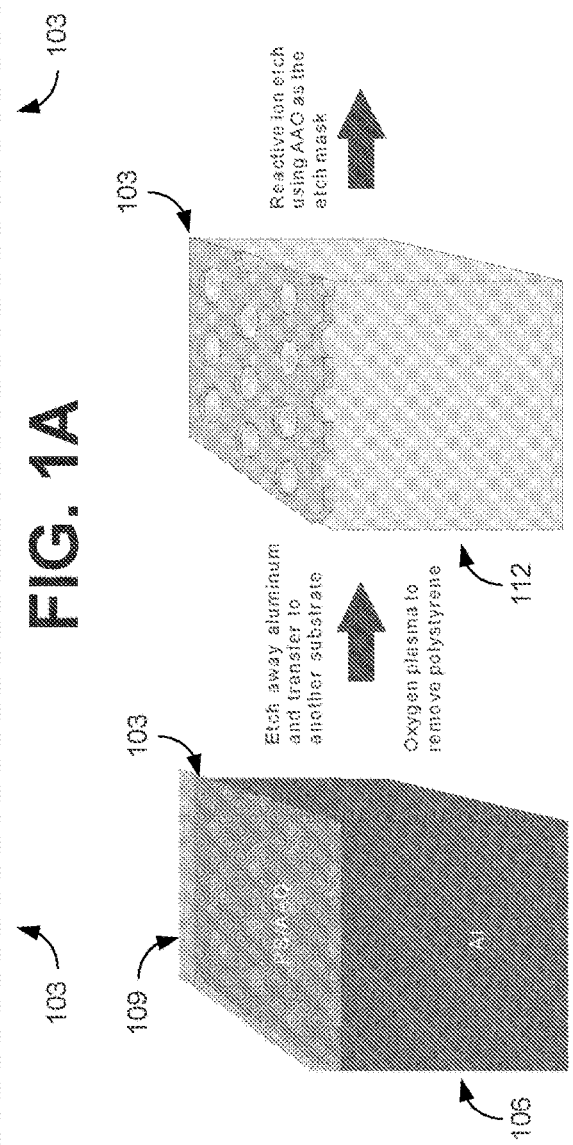
FIG. 1A
FIG. 1B
FIG. 1C

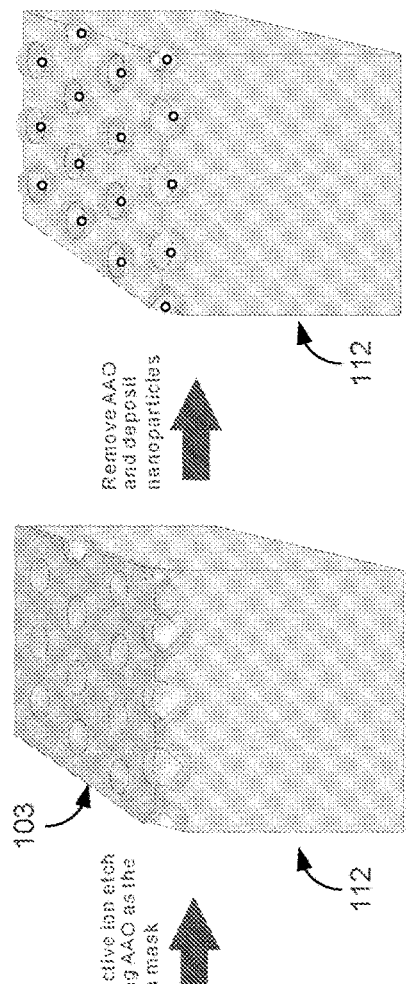
FIG. 1E
FIG. 1F
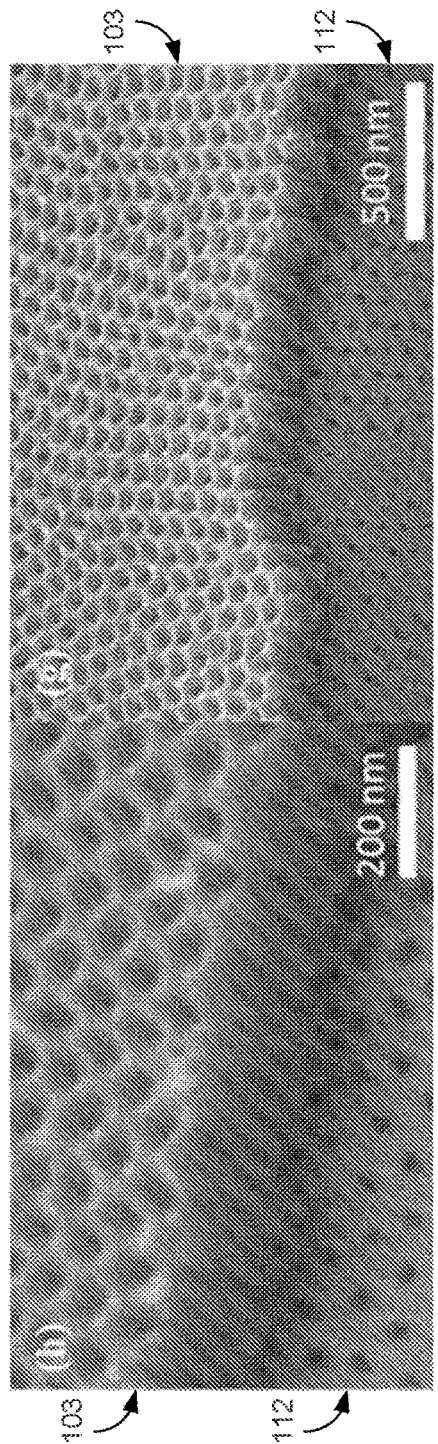
FIG. 1G

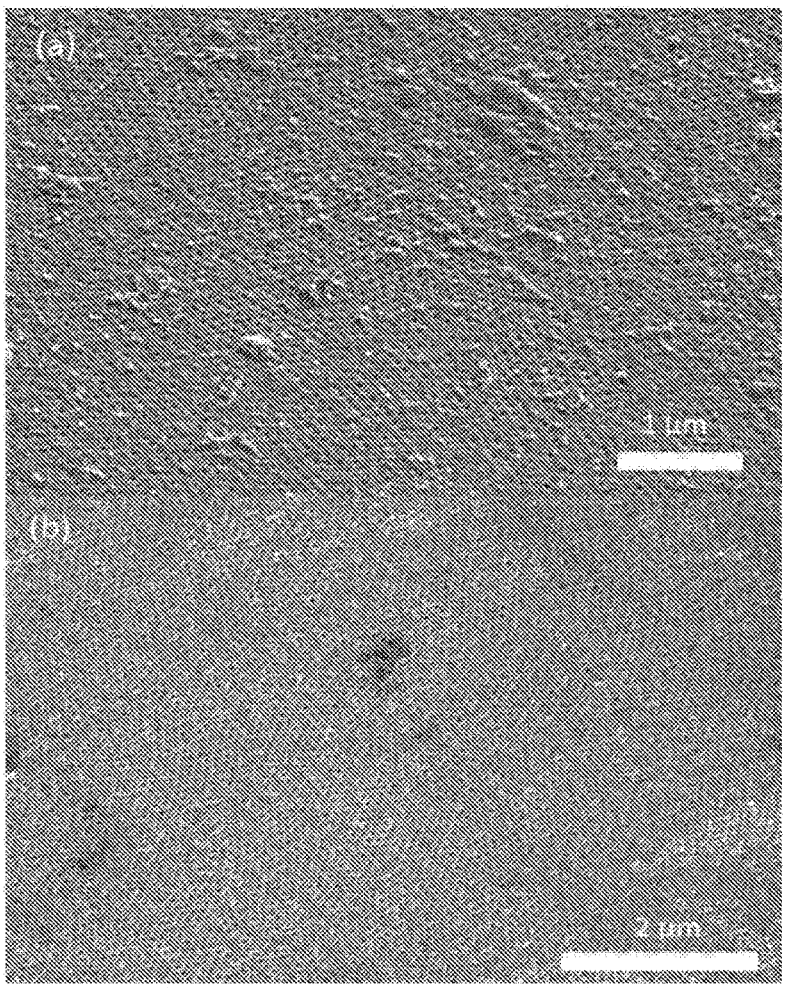
FIG. 2E
FIG. 2F
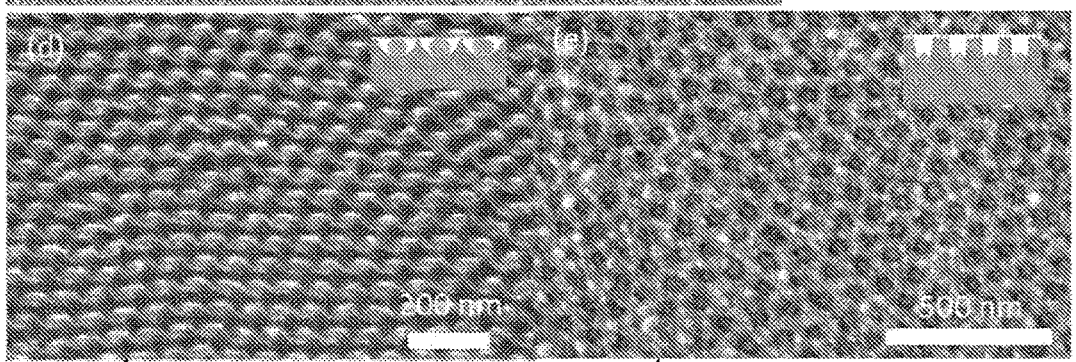
FIG. 2G
FIG. 2H

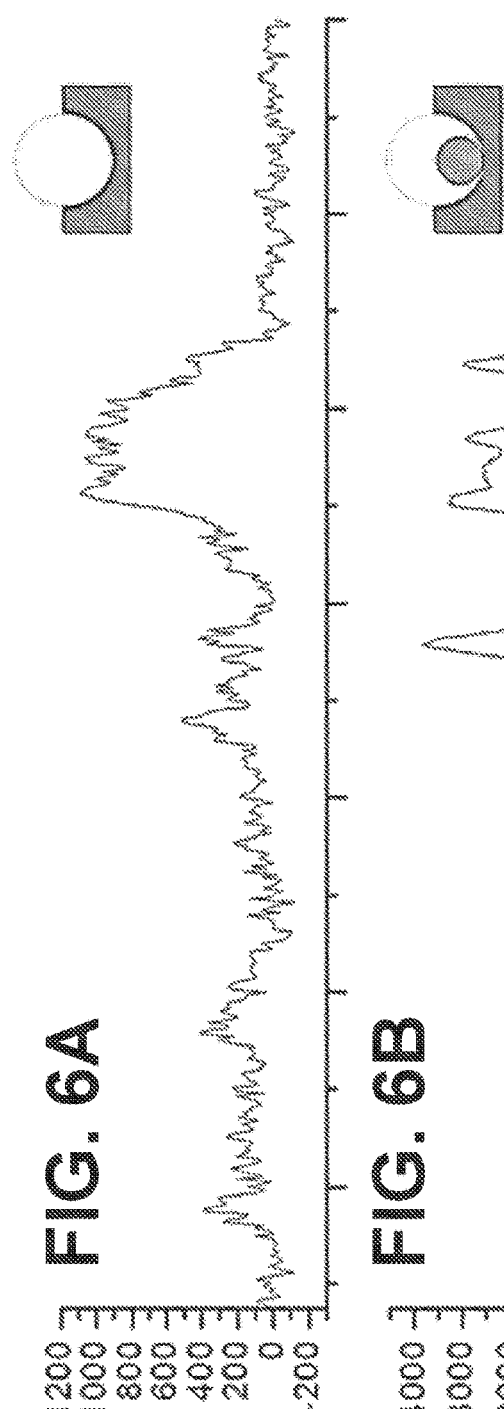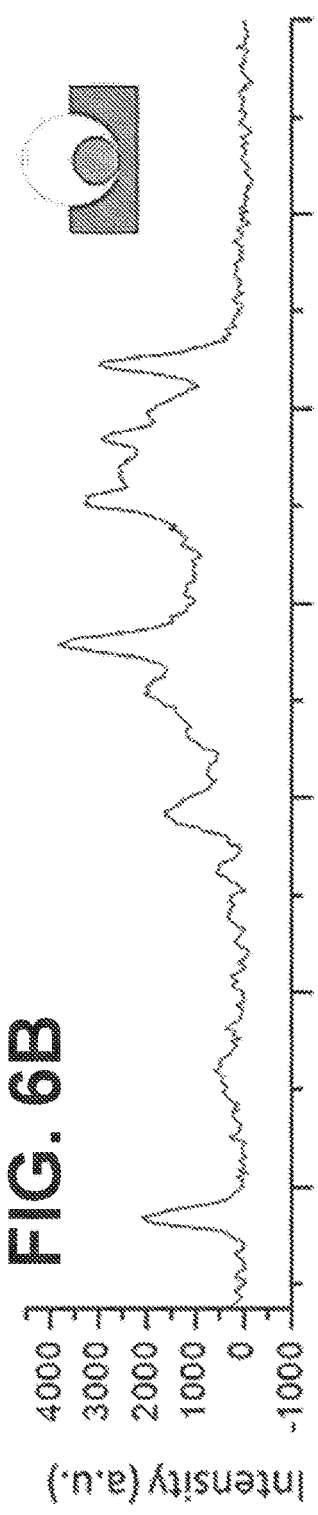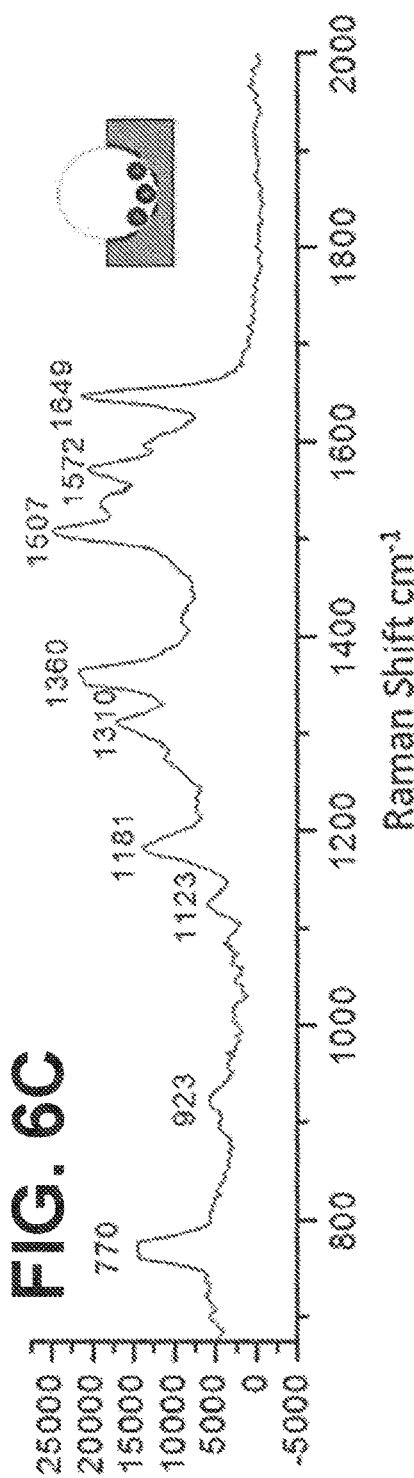

FABRICATION OF THERMALLY STABLE NANOCAVITIES AND PARTICLE-IN-CAVITY NANOSTRUCTURES

CROSS REFERENCE TO RELATED APPLICATIONS

This application is the 35 U.S.C. § 371 national stage application of PCT Application No. PCT/US2016/064664, filed Dec. 2, 2016, which claims priority to, and the benefit of, U.S. provisional application entitled "Fabrication of Thermally Stable Nanocavities and Particle-in-Cavity Nanostructures" having Ser. No. 62/263,010, filed Dec. 4, 2015, both of these applications are hereby incorporated by reference in their entireties.

STATEMENT REGARDING FEDERALLY SPONSORED RESEARCH OR DEVELOPMENT

This invention was made with government support under grant number N00014-12-1-0945 awarded by the U.S. Navy Office of Naval Research and grant number CBET-1033736 awarded by the National Science Foundation. The government has certain rights in the invention.

BACKGROUND

There has been interest in generating hierarchical assemblies of periodic nanoparticle arrays on large-area substrates for a wide range of applications including nanoplasmonics, photochemical catalysts, batteries, photovoltaics, and biological sensors. Studies have focused on the nanoparticle assembly onto a flat surface using techniques such as electron beam lithography, nanoimprint lithography, or block copolymer as lithography mask. However, techniques to fabricate a particle-in-cavity (PIC) nanostructure are lacking despite the advantages of this architecture in many applications.

SUMMARY

Embodiments of the present disclosure are related to fabrication of thermally stable ultra-high density nanocavities and particle-in-cavity (PIC) nanostructures.

In one embodiment, among others, a method comprises disposing an anodized aluminum oxide (AAO) template onto a surface of a substrate, where the AAO template comprises a support layer disposed on a side of the AAO template opposite the surface of the substrate; removing the support layer from the AAO template; etching nanocavities into the surface of the substrate using the AAO template as an etch mask; and removing the AAO template from the surface of the substrate. In one or more aspects of these embodiments, the method can comprise inserting nanoparticles into the nanocavities. The nanoparticles can be deposited into the nanocavities by sputtering and annealing. The nanoparticles can be deposited into the nanocavities by spin coating a nanoparticle solution on the surface of the substrate. The nanoparticles can be deposited into the nanocavities by e-beam evaporation. A plurality of nanoparticles can be deposited in individual nanocavities. The support layer can be a polystyrene (PS) support layer.

In one or more aspects of these embodiments, the method can comprise forming the support layer on the side of the AAO template. The method can comprise fabricating the AAO template on an aluminum substrate by anodization of an aluminum film; and removing the AAO template from the aluminum substrate after formation of the support layer on the AAO template. The method can comprise transferring the AAO template to the substrate in a liquid. The support layer can be removed by oxygen plasma. The nanocavities can be etched into the surface of the substrate using reactive ion etching (RIE). Geometries of the nanocavities can be based at least in part upon a gas used for the RIE and a material of the substrate.

In one or more aspects of these embodiments, isotropic etching can form a nano-dimpled surface on the substrate. In one or more aspects of these embodiments, anisotropic etching can form a nano-porous surface on the substrate. The substrate can be a silicon substrate, a glass substrate, or an indium tin oxide (ITO)-coated substrate. The AAO template can include pores having a pore diameter of about 60 nm or less. The pore diameter can be about 30 nm or less. The pores can have an interpore distance of about 100 nm or less. The AAO template can have a thickness of about 200 nm or less.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1A through 1H are images and schematic diagrams illustrating an example of fabrication of nanocavities and particle-in-cavity (PIC) nanostructures on a substrate surface in accordance with various embodiments of the present disclosure.

FIGS. 2E and 2F are images of example nanocavites formed on a surface of a glass substrate and indium tin oxide (ITO)-coated substrate, respectively, in accordance with various embodiments of the present disclosure.

FIGS. 2G through 2I are images of PIC nanostructures formed on a surface of a silicon substrate in accordance with various embodiments of the present disclosure.

FIGS. 6A through 6C are plots of measured surface enhancement Raman scattering (SERS) spectra of a monolayer of dye molecules for a nanocavity reference surface, an Au PIC nanostructure, and an iron oxide PIC nanostructure in accordance with various embodiments of the present disclosure.

DETAILED DESCRIPTION

Figure 1D:
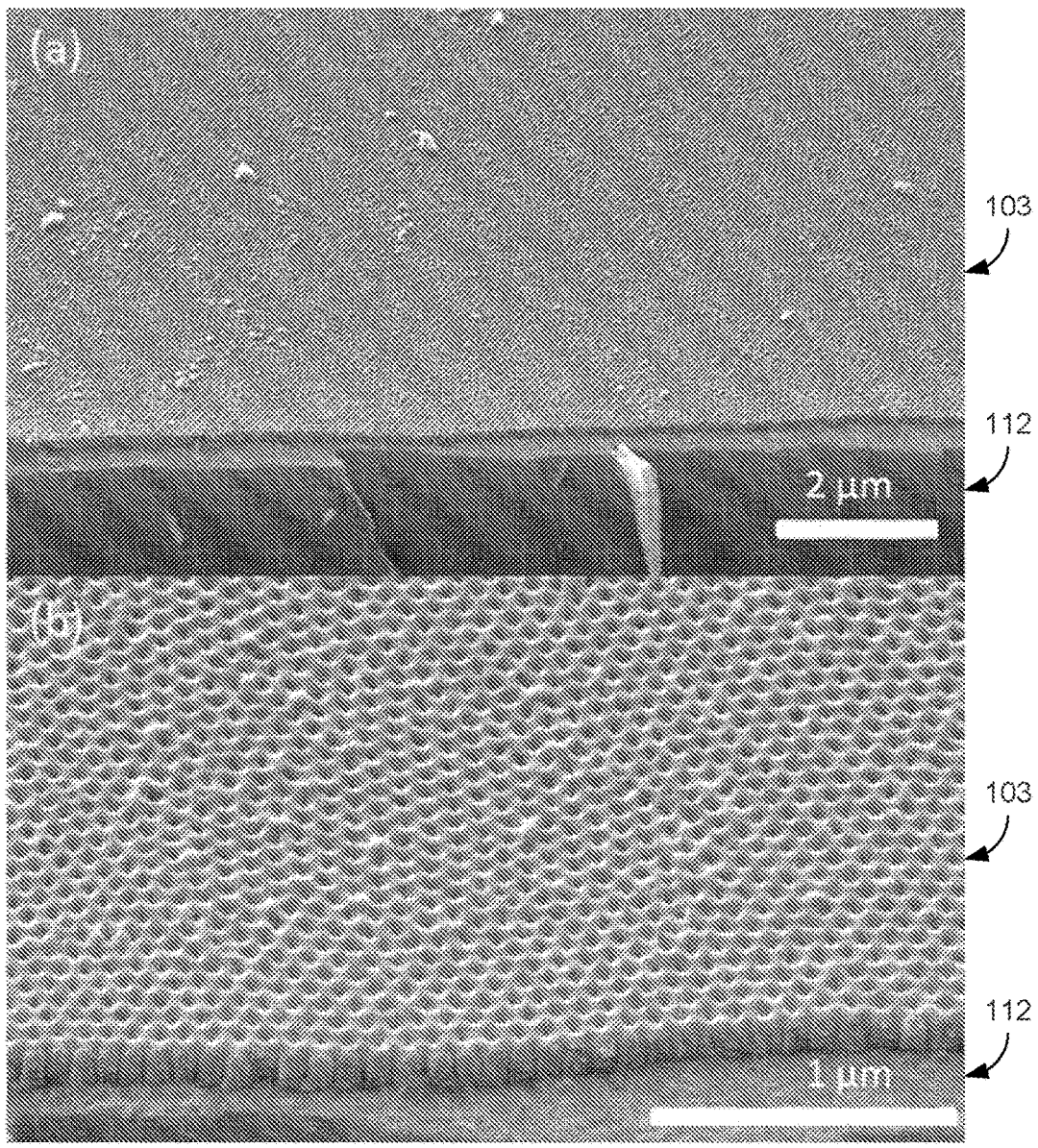

Disclosed herein are various embodiments of methods related to fabrication of thermally stable ultra-high density nanocavities and particle-in-cavity (PIC) nanostructures. The PIC nanostructures may be fabricated with near-perfect ordering. Reference will now be made in detail to the description of the embodiments as illustrated in the drawings, wherein like reference numbers indicate like parts throughout the several views.

Particle-in-cavity (PIC) architectures can provide extremely high field enhancement in surface enhancement Raman scattering (SERS) due to the cascaded focusing of the optical cross-sections into small gaps. The PIC nanostructure can provide a high degree of density control, as well as surface stability at high temperature. For example, the PIC nanostructure can be used as an effective catalyst bed for vapor phase growth of nanowires or nanotubes. Since this method of nanowire growth is generally used for energy conversion and storage devices, the PIC nanostructure allows nanowires to be embedded into the electrical conductive interlayer to provide much better electrical contact. Additional applications using PIC nanostructures can include, e.g., active optical photodiodes to convert light directly to current and/or nanoreactors that use the formation of surface plasmons in tandem with thermal energy to drive a catalytic chemical reaction.

E-beam lithography combined with nano imprinting and dry etching has traditionally been used to pattern nanocavities with regularity onto a relatively large substrate. These processes are time consuming and generally require expensive equipment, tedious sample preparation, and an experienced operator, which makes it difficult to be economically viable. Alternative implementations can use block copolymers as a lithography template to transfer a pattern onto the underlying substrate. However, the block copolymer often forms a mixture of spherical, lamellar, and cylindrical morphologies due to interfacial energetics, which hinders the use of block copolymer templates on large-area substrates with consistency and reproducibility. Even though the feature size of the copolymer template can be tuned by changing concentration and type of solvent, the interpore distance remains difficult to control. Pre-patterned iron oxide nanoparticles with a size of approximately 10 nm may be used as the lithography mask to produce an ultra-small PIC nanostructure on a silicon (Si) substrate. However, during the self-assembly of small nanoparticles into dense arrays, defects can easily be introduced and the gaps between nanoparticles are difficult to control. These gaps are typically too small, which makes the etching of the underlying substrate difficult through these small gaps.

Anodized aluminum oxide (AAO), a hexagonally closely packed porous material produced by the anodization of aluminum (Al), can be used as a template to synthesize nanostructures of various materials. By changing the voltage, temperature, concentration and type of electrolyte, the pore diameter and interpore distance can be precisely controlled with excellent uniformity and consistency. However, preparing nanostructures using AAO template on a foreign substrate can be challenging. For example, thermal or e-beam evaporation of an aluminum thin film onto an indium tin oxide (ITO) or Si substrate can be used, followed by fabrication of AAO by anodization of the deposited aluminum film. Due to the volume expansion of aluminum to alumina during the anodization process, the poor adhesion between the AAO and the substrate often leads to the delamination of the AAO.

A non-lithographic patterning method of fabricating highly ordered nanoparticle arrays, such as gold (Au), with uniform dimension under 100 nm onto various substrates can use the AAO as a deposition mask. The AAO template is removed to expose the Au nanoparticles since the Au is also deposited on the surface. However, removing the AAO template makes the Au nanoparticles prone to Ostwald ripening at high temperature or longer duration. In the present disclosure, AAO is used as a template to create a particle-in-cavity nanostructure to enhance the surface stability of nanoparticles at high temperature, which can then be used as a platform to investigate nanowire growth and/or SERS signal enhancement. The fabrication of a nanocavity structure with features as small as 10 nm has been demonstrated with excellent ordering using AAO transfer.

A simple and effective fabrication of large scale particle-in-cavity (PIC) nanostructures with a tunable size in a range from about 10 nm to about 100 nm will now be discussed. By using pre-patterned anodized alumina template (AAO) as a mask for reactive ion etching, the hexagonally ordered nano-porous structure can be transferred onto various substrates (e.g., glass, ITO-coated glass, and silicon). With the support of an organic polystyrene layer, the AAO template can be easily transferred with great consistency and minimal contamination. This method also provides versatility in fabricating multiple unique nanostructures depending on the choice of gas used for reactive ion etching (RIE). Nanoparticles can be deposited into nanocavities using a variety of techniques such as e-beam evaporation, sputtering with annealing or spin coating of pre-made nanoparticle suspension. A gold (Au) PIC nanostructure has demonstrated excellent thermal stability compared to Au nanoparticles deposited on a flat surface. This method may be used for the investigation of nanopatterning and nanoparticle assembly, as well as for enhanced surface Raman scattering and nanowire-based devices including sensors, electronics and photovoltaics.

Referring to FIGS. 1A through 1H, shown is an example of a fabrication procedure for the PIC nanostructure. The process includes fabrication of an AAO template by a two-step anodization of the Al film, spin coating of a polystyrene (PS) thin film as a support layer on the AAO template, transfer and mounting of the AAO template onto a substrate of choice, dry etch of the chosen substrate with a reactive ion etch (RIE) using the AAO template as the etch mask, removal of the AAO template, and deposition of nanoparticles into the resulting nanocavities.

Initially, a closely packed hexagonal AAO porous template can be synthesized by applying the anodization of the aluminum film in oxalic acid, resulting in a pore diameter in a range from about 30 nm to about 60 nm and an interpore distance in a range from about 80 nm to about 100 nm. The pore diameter and interpore distance depends on the concentration of the electrolyte of oxalic acid and the anodization voltage. In various embodiments, the pore diameter can be about 60 nm or less and the interpore distance can be about 100 nm or less. FIG. 1A shows scanning electron microscope (SEM) images of an example of a 40 nm AAO template 103 produced in 0.3 M oxalic acid, which was used to demonstrate the transfer process. The closely packed hexagonal ordering of the AAO template 103 is evident. In other embodiments, the pore diameter can be about 30 nm or less, about 20 nm or less or about 10 nm or less. For example, anodization using selenic acid as the electrolyte can result in pore diameters of about 10 nm. Generally, the bottom of each pore of the AAO template 103 includes a thin barrier layer film separating the AAO template 103 from the surface of the Al substrate 106 (FIG. 1B). The barrier layer is part of the AAO and includes oxide that has not been converted to porous form as a result of the anodization. Depending on the pore diameter and length of anodization, the thickness of the AAO barrier layer can vary from about 10 nm to about 100 nm. The AAO barrier layer can be etched away during the pore opening process using phosphoric acid. The etching time dictates the resulting pore size of the transferred pattern.

As RIE is a line of sight process, a thick AAO template 103 can limit the effectiveness of an etching process because of the increased effect on gas diffusion and any misalignment of the substrate relative to the electron beam. Thus, the thickness of AAO template should be kept to a minimal thickness (e.g., about 200 nm or less) to ensure the uniformity of etching. It is important to note that a free-standing thin AAO template 103 is very difficult to handle. The ultra-thin membrane of the AAO template 103 can easily break apart during the transfer process in liquids such as $CuCl_2$ (used for backside Al etching), $H_3PO_4$ (used for pore opening), and/or DI water (used for cleaning), without the aid of a supporting organic layer. The transfer process without the supporting organic layer has low consistency without extremely cautious operation. For example, during backside aluminum etching in $CuCl_2$ solution, most samples either sink to the bottom or break apart on top of the solution. During the pore widening process in phosphoric acid, the few surviving AAO templates tend to sink or float somewhere in the solution and became difficult to locate as the AAO template 103 becomes more transparent.

To improve the consistency and reproducibility of the transfer of the AAO template 103, a support layer can be applied to the AAO template 103 during transfer. As illustrated in FIG. 1B, the support layer 109 can be formed by spin coating a thin film of polystyrene (PS) on the AAO template 103. By using polystyrene as the support layer 109 of the AAO template 103, transferring the AAO template 103 into different liquids can be easily accomplished without breaking the membrane, thereby greatly improving the consistency and reproducibility of the process. Other polymers, such as PMMA, PDMS, or polyethylene, can also be used to form the support layer. The AAO template and PS support layer 109 can be removed by etching away the aluminum of the substrate 106 as described above. Even though a small percentage of samples may suffer from poor adhesion between the AAO template 103 and the PS support layer 109, which can lead to etching from both sides during the pore widening process because of the poor attachment, most samples can be successfully transferred and mounted on the chosen substrate 112 (e.g., glass, ITO-coated glass, Si, etc.), as shown in FIG. 1C.

Instead of using acetone or chloroform to wash away the polymer, the PS support layer 109 can then be removed using oxygen plasma. Without the need to remove the organic layer using an organic solution, the resulting nano-particle deposition can result in an extremely uniform surface pattern, which is free of organic contamination. FIG. 1D shows SEM images with the AAO template 103 transferred onto a Si substrate 112 after the transfer and removal of the PS support layer 109 by oxygen plasma. As can be seen, organic contamination was minimized by optimizing the oxygen plasma operating conditions for the PS.

Figure 1H:
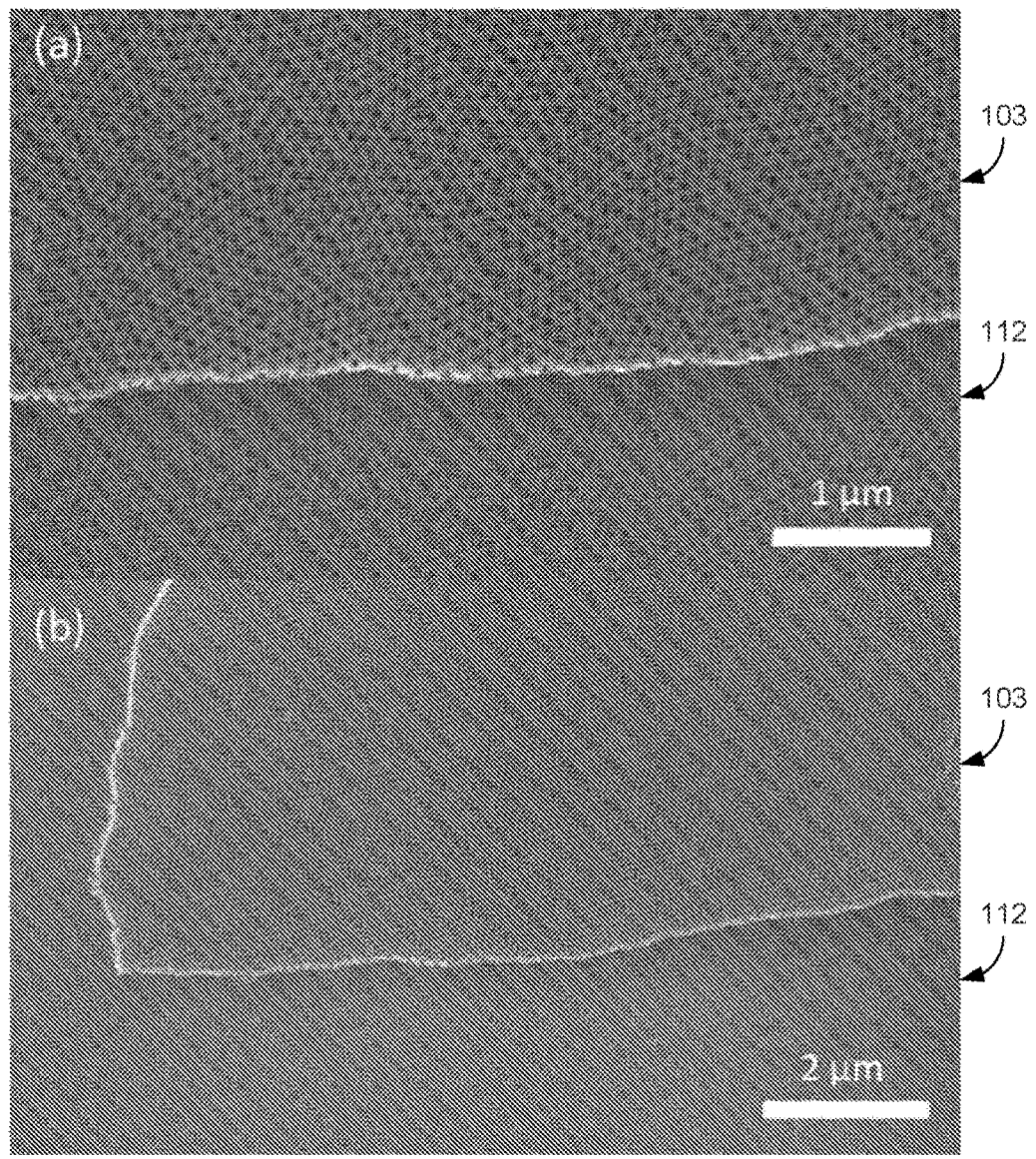

After removing the organic PS support layer 109 from the top of the AAO template 103 after the transfer process, the nanocavity structure can be created in the chosen substrate 112 using the AAO template 103 as the etching mask for RIE, as illustrated in FIG. 1E. The RIE conditions are dependent on the materials of the substrate 112 and the depth of the pores. The AAO template 103 can then be removed to expose the etched substrate 112, as depicted in FIG. 1F. The SEM images in FIGS. 1G and 1H show examples of the nano-pore structure after RIE with a piece of AAO template 103 still attached on the substrate 112 to highlight the mirror-like transfer of the hexagonally close-packed structure from the AAO template 103 to the chosen substrate 112.

Figures 2A, 2B:
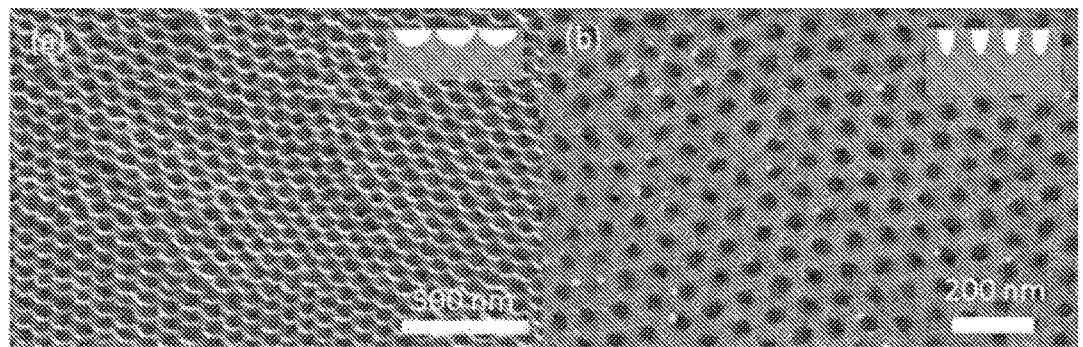
FIGS. 2A through 2D are images of nanocavites formed on a surface of a silicon substrate in accordance with various embodiments of the present disclosure.

For a Si substrate 112, two different types of morphology can be fabricated depending on the combination of gases selected for the RIE process. The more isotropic etching of the Si surface can be achieved using a combination of oxygen and sulfur hexafluoride gas. FIG. 2A shows a SEM image of a nano-dimpled surface 203$d$ fabricated with this morphology. The more anisotropic etching of the Si surface can be achieved using a combination of argon and chlorine gas. FIG. 2B shows a SEM image of a nano-porous surface 203$p$ with a tunable aspect-ratio fabricated with this second morphology. The nano-pores and nano-dimples appear darker compared to the brighter contrast of AAO template 103 and the substrate 112.

In the fabricated substrates 112 of FIG. 2A, the pore diameter of the cavities becomes larger during isotropic etching by about 50% to about 80 nm. On the other hand, the pore size (diameter) of the fabricated substrates 112 of FIG. 2B was about 40 nm, which was slightly smaller than the pore size of the AAO template 103, while the interpore distance was about 100 nm which was identical to the AAO template 103. During the RIE process, the pore diameter and thickness of the AAO template 103 can be selected for consistent etching. For instance, an AAO template 103 including pores with a 40 nm diameter and a membrane thickness of 200 nm easily produced a nano-porous surface with nearly identical pore size. Increasing the thickness or decreasing the pore size of the AAO template 103 can cause more variation in gas diffusion and misalignment between pores and the substrate 112. As a result, the nano-pores may not be as uniform in size.

Figure 2C:
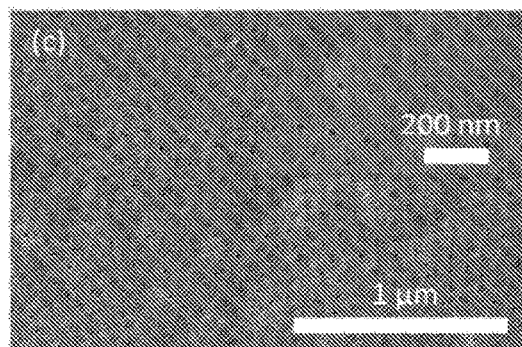
Figure 2D:
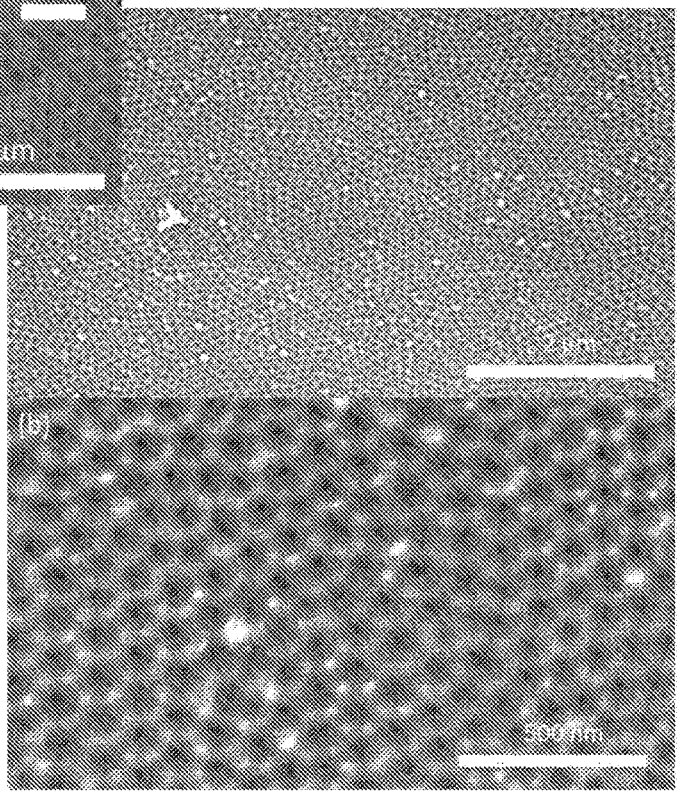

FIGS. 2C and 2D show an example of a 10 nm nano-porous surface fabricated using an AAO template 103 with identical pore size. The 10 nm AAO template 103 was created using selenic acid as the electrolyte. With the appropriate concentration and anodization voltage, a hexagonal pattern was obtained with an interpore distance of about 100 nm, but the pore size had a larger distribution than the 40 nm nano-porous surface.

Besides silicon, the transfer technique can also be applied to glass and ITO coated glass followed with RIE, which can be optimized for that specific surface. Similar hexagonally packed nano-porous surfaces were observed on both surfaces after RIE. FIGS. 2E and 2F are SEM images for nano-porous surfaces after RIE using an AAO template 102 as the etch mask on glass and ITO-coated glass, respectively.

Once the AAO template 103 is removed, the PIC nanostructure can be created as shown in FIG. 1F by simply spin coating the surface with a pre-made nanoparticle suspension or by sputtering a thin layer of gold on the surface and then annealing. In the fabricated examples, a thin layer of Au was sputtered and annealed to create a PIC nanostructure. FIGS. 2G and 2H are SEM images demonstrating the Au PIC nanostructure on Si nano-dimpled surface 203*d* and nano-porous surface 203*p*, respectively. By depositing and annealing Au after removing the AAO template 103, Au nanoparticles were all sitting at the bottom of the nano-pores (FIG. 2H) or nano-dimples (FIG. 2G) created during the RIE process. The size of the nanoparticles is dependent on the pore size of the AAO template 103 and the thickness of sputtered Au film. The center-to-center distance between neighboring nanoparticles was about 100 nm, which is identical to the interpore distance of the AAO template 103.

Figure 2I:
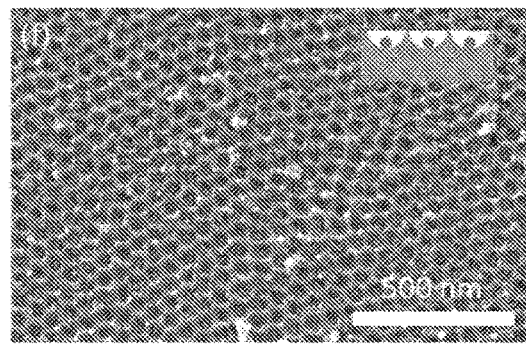

During the deposition of the film, gold was deposited everywhere on the substrate. When annealed at 600° C., the gold diffused into the cavities and formed the nanoparticles, with a size dependent upon the sputtered film thickness. However, Au was also deposited on the top of the non-porous part of substrate 112 between pores and formed small particles there as well. To avoid this problem, a suspension of pre-made nanoparticles can be applied to the surface during spin coating. For example, iron oxide nanoparticles with a diameter of 25 nm in chloroform was applied on the nano-dimpled Si surface 203*p* using spin coating. Since the pore diameter was larger than that of the iron oxide nanoparticles, as many as seven nanoparticles could be deposited into a single nano-pore, depending on the concentration of the suspension. As shown in FIG. 2I, one or two nanoparticles were deposited in each nano-pore using a concentration of 5 mg/μL.

Figures 3A, 3B:
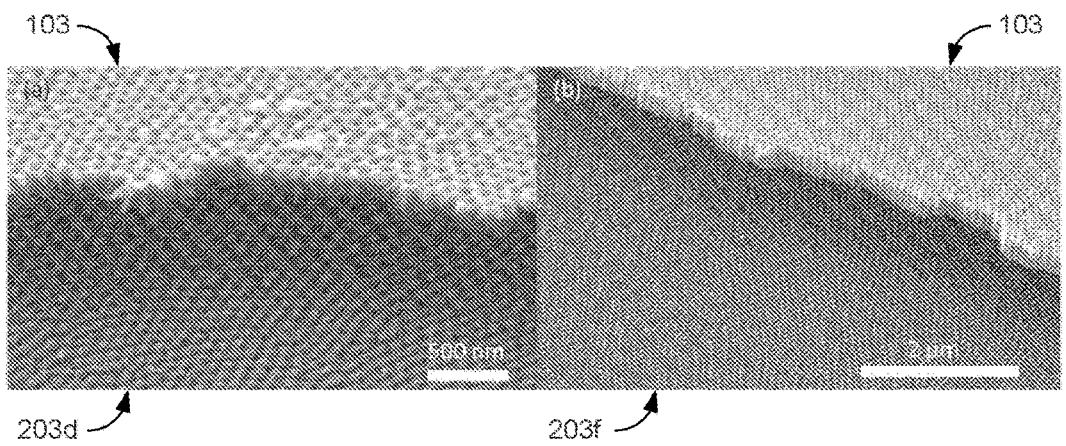
FIGS. 3A, 3C, 3E and 3B, 3D, 3F are images of examples of a PIC nanostructure and particles on a flat surface, respectively, at three annealing conditions (0, 3 and 11 hours) in accordance with various embodiments of the present disclosure.

The thermal stability of the Au PIC nanostructure was investigated and compared with that of Au nanoparticles on a flat surface. To prepare both structures, Au was deposited by e-beam evaporation using an AAO template 103 as the deposition mask on both a flat Si surface 203*f* and a nano-dimpled Si surface 203*d* (e.g., FIG. 2G). Then the AAO template 103 was removed followed by annealing at 600° C. for 3 hours and 11 hours. FIGS. 3A-3F are SEM images of the Au nanoparticles on the flat surface 203*f* and nano-dimpled surface 203*d* with no annealing and after annealing at 600° C. for 3 h and 11 h. FIG. 3A shows Au nanoparticles deposited on the nano-dimpled Si surface 203*d* and FIG. 3B shows Au nanoparticles deposited on the flat surface 203*f*. In both cases, the Au nanoparticles were deposited by e-beam deposition using an AAO template 103 as the deposition mask. After deposition, the Au nanoparticles had a diameter of about 50 nm on both surfaces 230*d* and 203*f*, and provided a pattern that mirrored the AAO template.

Figures 3C, 3D:
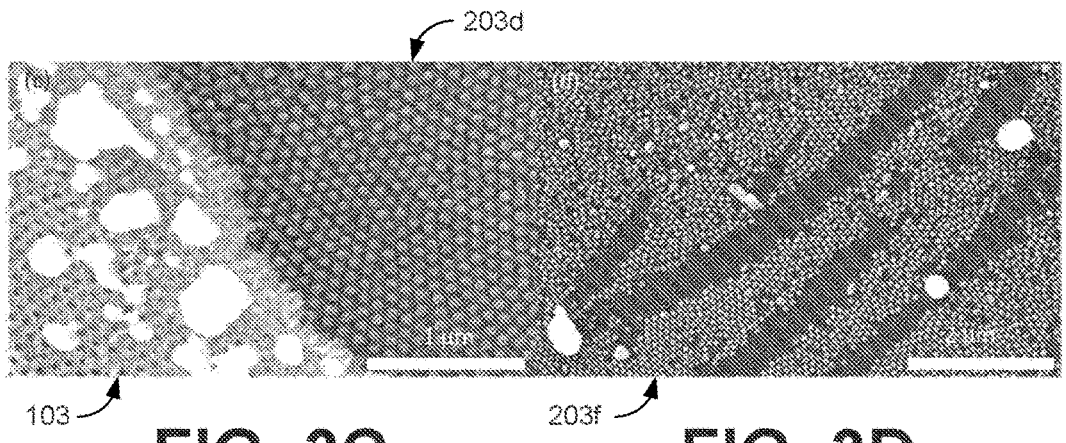
Figures 3E, 3F:
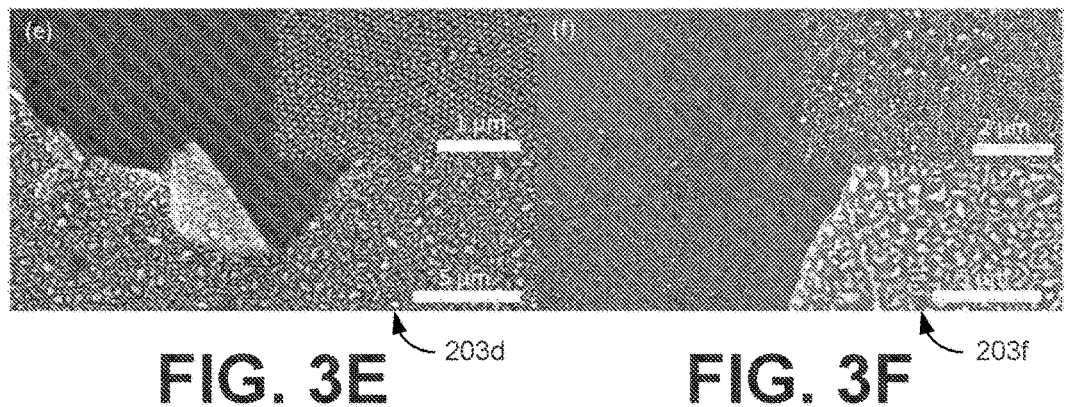

As shown in FIG. 3C, the Au deposited on top of the AAO template 103 started to form islands after annealing at 600° C. for 3 hours, while the Au nanoparticles inside the nano-dimples of the surface 230*d* still maintained the same size and ordering. However, as shown in FIG. 3D, Ostwald ripening started to take place on the flat Si surface 203*f* after annealing at 600° C. for 3 hours, as the smaller nanoparticles dissolved and combined to form larger particles with diameters of up to about 200 nm. Interestingly, even larger particles with diameters of about 500 nm were formed like snowballs through nanoparticle coagulation and coalescence, attaching all the small nanoparticles on the trail. As shown in FIG. 3E, only a few spots were observed where two adjacent nanoparticles coagulated and formed a larger particle on the nano-dimpled surface 203*d* after annealing at 600° C. for 11 hours. For the flat Si surface 203*f* shown in FIG. 3F, Au nanoparticles started to lose the ordering after annealing at 600° C. for 11 hours while Ostwald ripening continued to evolve with the formation of more particles with even larger size.

Figure 4A:
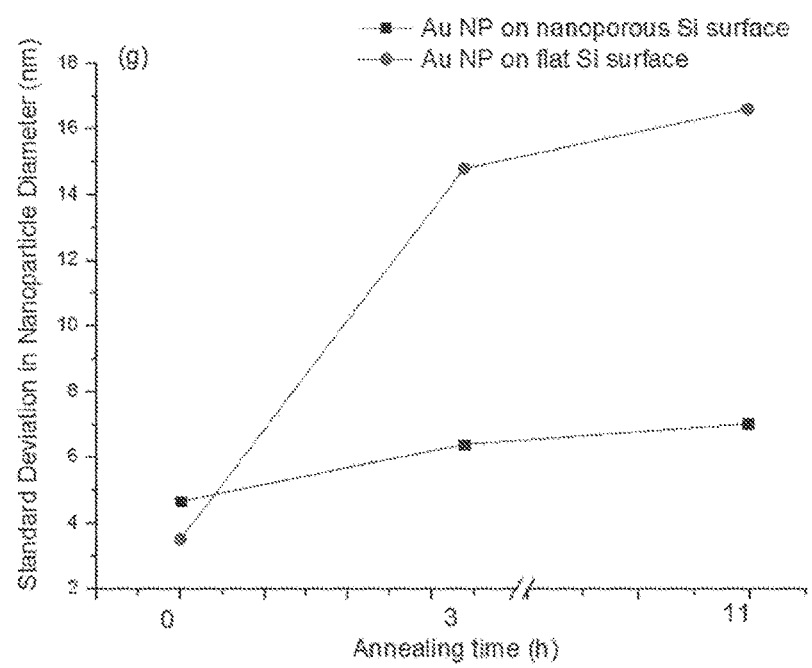
FIG. 4A is a plot of standard deviation of size distribution of the PIC nanostructure and the particles on a flat surface at the three annealing conditions of FIGS. 3A-3F in accordance with various embodiments of the present disclosure.
Figure 4B:
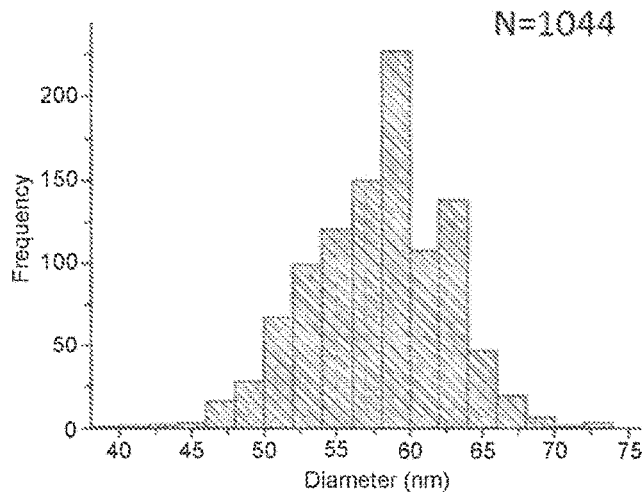
FIGS. 4B through 4G are histograms of the nanoparticle size distribution of the PIC nanostructure and the particles on a flat surface at the three annealing conditions of FIGS. 3A-3F in accordance with various embodiments of the present disclosure.
Figure 4D:
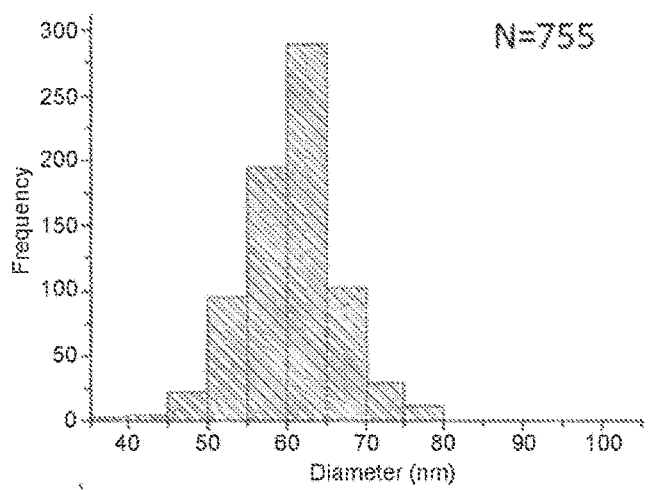
Figure 4F:
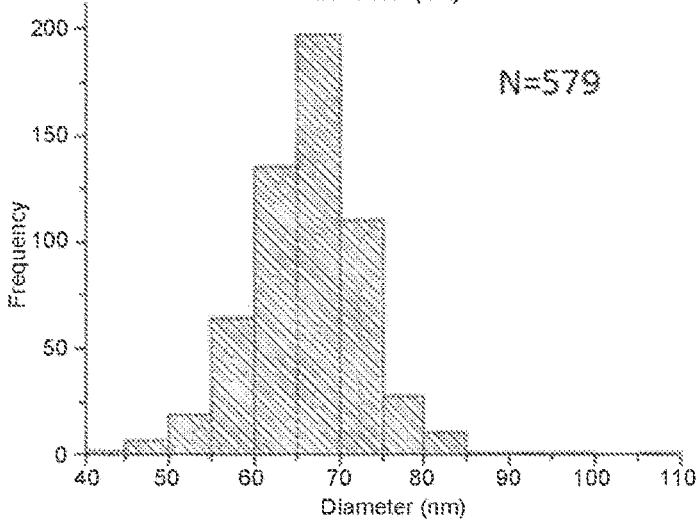
Figure 4C:
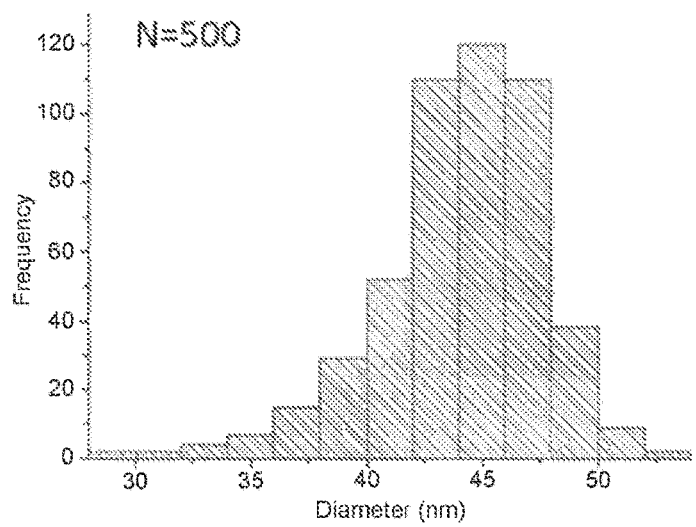
Figure 4E:
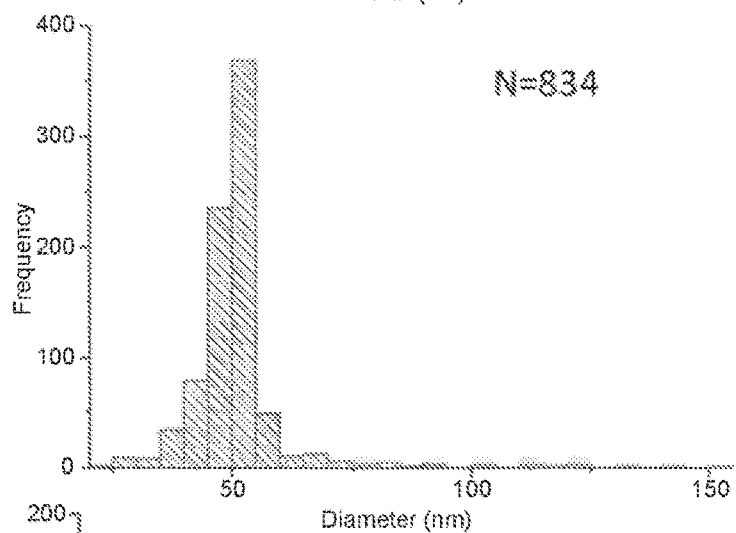
Figure 4G:
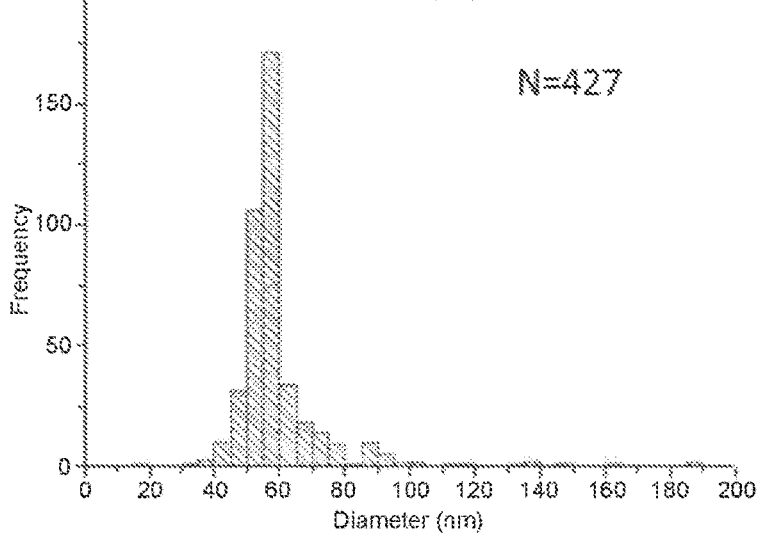

Referring to FIG. 4A, shown is a plot demonstrating the standard deviation calculated from the size distribution of both structures over time at the three annealing conditions (0, 3 and 11 hours) and sample sizes from 500 to 1000 nanoparticles. FIGS. 4B-4G are histograms of the nanoparticle size distribution of Au nanoparticles (fabricated by e-beam evaporation using the AAO template 103 as the deposition mask) for the three conditions. FIG. 4B shows the size distribution of the nanoparticles formed on the nano-dimpled surface 203*d* of FIG. 3A and FIG. 4C shows the size distribution of the nanoparticles formed on the flat surface 203*f* of FIG. 3B, at the beginning of annealing. FIG. 4D shows the size distribution of the nanoparticles on the nano-dimpled surface 203*d* of FIG. 3C and FIG. 4E shows the size distribution of the nanoparticles on the flat surface 203*f* of FIG. 3D, after 3 hours of annealing. FIG. 4F shows the size distribution of the nanoparticles on the nano-dimpled surface 203*d* of FIG. 3E and FIG. 4G shows the size distribution of the nanoparticles on the flat surface 203*f* of FIG. 3F, after 11 hours of annealing.

As shown in FIG. 4A, the standard deviation for Au nanoparticle diameters on the nano-dimpled surface 203*d* was 4.72 nm, 6.44 nm, and 7.07 nm at three annealing conditions (0, 3 and 11 hours) respectively, indicating that the morphology was not changed much during annealing. However, the standard deviation for Au nanoparticle diameters on the flat Si surface 203*f* increased from 3.57 nm to 14.84 nm and 16.65 nm after annealing for 3 and 11 hours due to the formation of large particles, showing that the thermal stability of Au nanoparticles on flat substrate was not as good as the Au PIC nanostructure.

To demonstrate the utility of the PIC nanostructure, silver-coated Au and iron oxide PIC nanostructures were used to measure the SERS signal enhancement for the detection of R6G dye molecules. Ag and Au nanostructures are traditionally investigated for the study of SERS signal enhancement due to the localized surface plasmon resonance of metallic nanostructures. Semiconducting nanoparticles are also often studied since the charge transferred from chemisorbed molecules would create the midgap states for the nanoparticles, resulting in a reduction of electronic excitation energy to allow laser-induced excitation from midgap states to the nanoparticle conduction band. The PIC nanostructure can further increase Raman activity due to the cascaded focusing of the optical cross-sections into small gaps. Furthermore, the number of hotspots may be maximized using the high density PIC nanostructure fabricated as described above.

Figure 5:
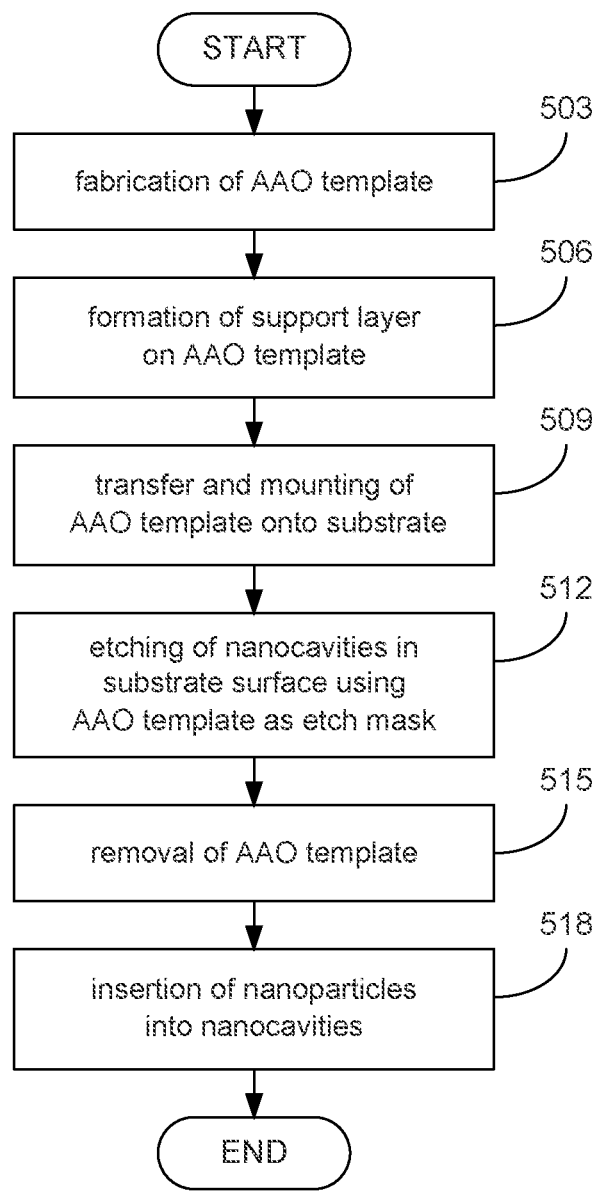
FIG. 5 is a flow chart illustrating an example of the fabrication of nanocavities and PIC nanostructures on a substrate surface in accordance with various embodiments of the present disclosure.

Referring to FIG. 5, shown is a flow chart illustrating an example of the fabrication of nanocavities and PIC nanostructures on a substrate surface. The process can include fabrication of an AAO template 103 (FIG. 1A) at 503 (e.g., by a two-step anodization of the Al film), formation of a support layer 109 (FIG. 1B) (e.g., by spin coating of a polystyrene (PS) thin film) on the AAO template 103 at 506, transfer and mounting of the AAO template 1103 onto a substrate 112 of choice at 509, etching nanocavities in a surface of the chosen substrate 112 (e.g., by dry etch with a reactive ion etch (RIE)) using the AAO template 103 as an etch mask at 512, removal of the AAO template 103 from the chosen substrate 112 at 515, and insertion of nanoparticles (e.g., by deposition and annealing) into the resulting nanocavities at 518. Various PIC nanostructures were fabricated in this way for testing and evaluation, as described below.

Anodized Alumina Fabrication. Aluminum film, 99.999% purity and 0.25 mm thick, was purchased from Goodfellow, Inc. The degreasing procedure of the aluminum film included sonication in soapy water, acetone, and ethanol for 20 minutes each. The degreased aluminum film was then annealed at 450° C. for 4 hours under an argon (Ar) environment to remove mechanical stress. After annealing, the aluminum film was electropolished at 18 V and 65° C. for 8 minutes using an aluminum (Al) electropolishing solution purchased from Electro Polish Systems.

Beginning at 503, an AAO template 103 (FIG. 1A) can be fabricated with 40 nm pores. A first anodization was carried out in 0.3 M oxalic acid at 40 V and 15 C for 12-16 hours with rigorous stirring. The AAO layer was then removed in the mixture of 1.8 wt % chromic acid and 6 wt % phosphoric acid at 65° C. The ultra-thin AAO template 103 with perfect ordering was then fabricated during the second anodization, which was carried out under similar conditions as the first anodization, but for only 2 minutes. A 10 nm AAO template fabrication was carried out in 0.3 M selenic acid at 1° C. for 12 hours for the first anodization and 5 minutes for the second anodization.

AAO Template Transfer. Following the fabrication of AAO template 103, a thin support layer 109 (FIG. 1B) of polystyrene was deposited on top of the AAO template 103 at 506 by spin coating at 3000 RPM for 1 minute using 2.5 wt % polystyrene in toluene. After annealing at 80° C. for 1 hour, the backside aluminum was removed using a 1 M $CuCl_2$ in 20 wt % HCl solution as part of the transfer at 509. The chosen substrates 112 (FIG. 1C), including silicon, glass, and ITO-coated glass, were degreased using similar conditions as the aluminum film and cleaned using UV ozone for 15 minutes. The AAO template 103 with PS support layer 109 was then transferred to 5 wt % phosphoric acid at 30° C. for 15-30 minutes to remove the barrier layer and widen the pores depending on the desired pore size. After cleaning in DI water, the AAO template 103 is transferred at 509 onto the substrate 112 of choice. Note that during the transfer of the AAO template 103 to various liquids ($CuCl_2$, phosphoric acid, DI water), the AAO template 103 with the PS support layer 109 was floating on the liquid at all time. The polystyrene (PS) film was then removed using oxygen plasma with inductively coupled plasma at 50 W each with oxygen flow of 40 sccm for 10 minutes.

Fabrication of PIC Nanostructure. To etch the nanocavities at 512, an RIE process was done using a RIE/ICP Unaxis SLR system to produce the nanoporous surfaces with the AAO template 103 as the etching mask. The conditions of RIE for Si, glass, and ITO coated glass are listed in Table 1 below. After removing the AAO membrane at 515, Au and iron oxide nanoparticles were inserted into the nanocavities at 518. The Au nanoparticles were deposited using sputtering with 1 nm/min deposition rate for 3-10 minutes depending on the desired nanoparticle size and subsequently annealed in air at 600° C. for 1 hour. The sputter deposition was done using a high resolution EMS150T ES sputter coater. The iron oxide nanoparticles were deposited using spin coating at 12000 RPM for 10 minutes with a suspended iron oxide nanoparticle solution (25 nm, 25 mg/μL diluted to 1 mg/μL) purchased from Ocean NanoTech, LLC. The Au nanoparticles were also fabricated by e-beam evaporation using the AAO template 103 as the deposition mask. The rate of evaporation was controlled at 1 Å/s for 400 seconds with no rotation.

TABLE 1

RIE conditions for Si, glass, ITO coated glass using AAO template as etch mask.

| Substrate | Gas | Power | Time | Pressure |
|---|---|---|---|---|
| Silicon | $SF_6$ 20 sccm $O_2$ 10 sccm for isotropic etching | 200 W | 1 min | 10 mtorr |
| | $Cl_2$ 10 sccm Ar 20 sccm for anisotropic etching | 400 W | 3 min | 95 mtorr |
| Glass | $CHF_3$ 25 sccm Ar 40 sccm | 300 W | 10 min | 60 mtorr |
| ITO coated glass | $Cl_2$ 10 sccm Ar 20 sccm for anisotropic etching | 400 W | 10 min | 95 mtorr |

Characterization. The size distribution for Au nanoparticles on a flat Si surface 203f and a nano-dimpled Si surface 203d at multiple annealing conditions was obtained using ImageJ analysis software. To obtain the most accurate calculation, the segmentation threshold on each sample was adjusted to provide the best segmentation of nanoparticles from the background. The total number of nanoparticles was from 500-1000. To prepare for SERS measurement, both devices were coated with 10 nm Ag film using sputtering and then dropped into R6G solution with a concentration of $10^{-7}$ M for 20 minutes. For the non-SERS reference sample, 10 nm Ag was sputtered on the nano-dimpled Si surface 203d and then dropped into $10^{-7}$ M R6G. Samples with iron oxide nanoparticles on a flat surface 203f coated with Ag 10 nm were also compared. Raman data was collected using a Horiba Jobin-Yvon LabRAM Aramis Raman Spectrometer with a 400 mm monochromator and CCD detector with 50× focal lens objective. Excitation was from a 0.06 mW 532 nm laser through a confocal pinhole of 100 μm. All SERS data was collected in one acquisition using a 10 second accumulation time with incident power reduced to 1% of the output. All SEM images were taken using a Phillips FEI XL-40 field emission SEM.

Referring to FIGS. 6A through 6C, shown are examples of measured SERS spectra of a monolayer of $10^{-7}$ M R6G dye molecules for the nano-dimpled Si surface 203d (FIG. 2A) as the reference sample, Au PIC nanostructure (FIG. 2G), and iron oxide PIC nanostructure (FIG. 2I) with seven nanoparticles in each cavity. The SERS measurements for all three samples were obtained under the same conditions. FIG. 6A is a plot illustrating the measured SERS spectra of a monolayer of $10^{-7}$ M R6G dye molecules in the nano-dimpled Si surface 203d with an Ag coating. FIG. 6B is a plot illustrating the measured SERS spectra of a monolayer of $10^{-7}$ M R6G dye molecules where Au nanoparticles are in the nano-dimpled Si surface 203d with an Ag coating. FIG. 6C is a plot illustrating the measured SERS spectra of a monolayer of $10^{-7}$ M R6G dye molecules where iron oxide nanoparticles are in the nano-dimpled Si surface 203d with an Ag coating. An excitation laser at 532 nm was used for the measurements.

As demonstrated in FIGS. 6B and 6C, the measured SERS signal for both PIC samples showed enhancement over the reference sample of FIG. 6A with the iron oxide PIC sample of FIG. 6C showing the strongest enhancement even though the SERS conditions had not been optimized. The measured SERS signal matched the Raman spectra of R6G molecules. In particular, the intensity at a Raman shift of 1360 $cm^{-1}$ was approximately 10 times stronger in FIG. 6B for the Au PIC sample and 70 times stronger in FIG. 6C for the iron oxide PIC sample over the reference sample. This result was in good agreement with the SERS behavior of other PIC nanostructures. The data demonstrates significant advantages of using a high density PIC nanostructure with both metallic and semiconducting nanoparticles. The size, oxide nature, and cavity geometry may be adjusted to optimize SERS measurement conditions to maximize the SERS enhancement.

The high density, hexagonally close packed particle-in-cavity nanostructures with tunable size from 10 to 100 nm were fabricated on large area by transferring the AAO template 103 onto a variety of substrates 112 including glass, ITO coated glass, and Si by using the AAO template 103 as a mask for reactive ion etching as shown in FIG. 1E. With the support of a thin organic PS layer 109 of FIG. 1B, the AAO template 103 can be easily transferred to the substrate 112 with great consistency and minimal organic contamination. Depending on the choice of RIE gas, either a nano-dimpled surface 203d (FIG. 2A) or a nano-porous surface 203p (FIG. 2B) can be fabricated for a given application. Nanoparticles were deposited into the nanocavities either by e-beam evaporation, sputtering followed by annealing or spin coating using pre-made nanoparticle suspension. By annealing at 600° C., the Au PIC nanostructure demonstrated excellent surface stability while Ostwald ripening and nanoparticle coagulation occurred on the flat surface. After that, nanoparticles on the nano-dimpled surface 203d were investigated for SERS application. Both Au PIC and iron oxide PIC samples showed SERS enhancement with the iron oxide PIC sample showing the strongest signal of 70 times intensity enhancement over the reference sample at Raman shift of 1360 cm$^{-1}$.

An inexpensive and versatile technique of fabricating large-area nanoparticle assembly, nanocavity and particle-in-cavity nanostructures that achieve ultra-high density patterns of nanocavities ($10^{11}$ cavities/cm$^2$) and tunable dimensions below 100 nm with perfect hexagonal ordering has been presented. This approach can be applied in many fields not just in the surface nanopatterning and nanoparticle array assembly, but also in the fabrication of nanoparticle based nanoplasmonics devices and nanowire based electronic and photovoltaic devices. Metal and semiconducting nanoparticles can trigger surface plasmon resonance that can substantially amplify electric response for applications such as surface enhanced Raman spectroscopy (SERS), photodetector, drug delivery, sensors, photovoltaics, nanowire based energy storage and conversion devices. Particle-in-cavity nanostructure can provide further plasmonic enhancement due to cascaded focusing of the optical cross-sections into small gaps. For all these applications, the device physics can be altered by tuning the dimensions of these nanostructures and aspects of the device performance can be proportional to the density of these nanostructures.

Metal nanoparticles may be used as a catalyst for high temperature vapor-liquid-solid (VLS) nanowire growth. However, Ostwald ripening can occur at high temperature, resulting in small particles dissolving and redepositing into large particles. Ostwald ripening reduces the density of the nanoparticles, resulting in a loss of density of nanowires as well. The described fabrication process results in a nanostructure that is extremely thermally stable, since the cavities provide a barrier to Ostwald ripening. As a result, nanostructures with an ultra-high density can be fabricated and maintained at the same density even after high temperature processing (e.g., annealing). Additionally, particle-in-cavity nanostructures can provide much better electrical contact for nanowire based devices since the nanowires are embedded in the conductive interlayer.

Fabrication of such a structure with excellent control over size, ordering and density can be challenging. Nonlithographic nanopatterning using anodized alumina as a mask can produce such nanostructures with perfect ordering on various substrates, as well as large area nanoparticle assembly, nanocavities, and particle-in-cavity nanostructure. The described fabrication can be used for industrial production of nanoparticle and nanowire based devices, allowing the performance per unit area to reach a cost-effective threshold. The nanoparticles of various materials can be deposited into nanocavities using techniques such as e-beam and thermal evaporation, spin coating, or sputtering. Since the device physics can be influenced with the dimension of these nanostructures, the excellent ordering and uniformity would provide great performance consistency. It also is suitable for use in high temperature applications that are hindered by Ostwald ripening for conventional nano-devices.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A method, comprising:
   disposing an anodized aluminum oxide (AAO) template onto a surface of a substrate, the AAO template comprising a support layer disposed on a side of the AAO template opposite the surface of the substrate;
   removing the support layer from the AAO template;
   etching nanocavities into the surface of the substrate using the AAO template as an etch mask; and
   removing the AAO template from the surface of the substrate.

2. The method of claim 1, comprising inserting nanoparticles into the nanocavities.

3. The method of claim 2, wherein the nanoparticles are deposited into the nanocavities by sputtering and annealing.

4. The method of claim 2, wherein the nanoparticles are deposited into the nanocavities by spin coating a nanoparticle solution on the surface of the substrate.

5. The method of claim 2, wherein the nanoparticles are deposited into the nanocavities by e-beam evaporation.

6. The method of claim 2, wherein a plurality of nanoparticles are deposited in individual nanocavities.

7. The method of claim 1, wherein the support layer is a polystyrene (PS) support layer.

8. The method of claim 1, comprising forming the support layer on the side of the AAO template.

9. The method of claim 8, comprising:
fabricating the AAO template on an aluminum substrate by anodization of an aluminum film; and
removing the AAO template from the aluminum substrate after formation of the support layer on the AAO template.

10. The method of claim 9, comprising transferring the AAO template to the substrate in a liquid.

11. The method of claim 1, wherein the support layer is removed by oxygen plasma.

12. The method of claim 1, wherein the nanocavities are etched into the surface of the substrate using reactive ion etching (RIE).

13. The method of claim 12, wherein geometries of the nanocavities are based at least in part upon a gas used for the RIE and a material of the substrate.

14. The method of claim 1, wherein isotropic etching forms a nano-dimpled surface on the substrate.

15. The method of claim 1, wherein anisotropic etching forms a nano-porous surface on the substrate.

16. The method of claim 1, wherein the substrate is a silicon substrate, a glass substrate, or an indium tin oxide (ITO)-coated substrate.

17. The method of claim 1, wherein the AAO template includes pores having a pore diameter of about 60 nm or less.

18. The method of claim 17, wherein the pore diameter is about 30 nm or less.

19. The method of claim 17, wherein the pores have an interpore distance of about 100 nm or less.

20. The method of claim 1, wherein the AAO template has a thickness of about 200 nm or less.

* * * * *